(12) United States Patent
Lozano et al.

(10) Patent No.: US 7,863,581 B2
(45) Date of Patent: Jan. 4, 2011

(54) FOCUSED NEGATIVE ION BEAM FIELD SOURCE

(75) Inventors: Paulo Lozano, Arlington, MA (US); Manuel Martinez-Sanchez, Lexington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 386 days.

(21) Appl. No.: 12/135,464

(22) Filed: Jun. 9, 2008

(65) Prior Publication Data
US 2009/0032724 A1 Feb. 5, 2009

Related U.S. Application Data

(60) Provisional application No. 60/942,846, filed on Jun. 8, 2007.

(51) Int. Cl.
*H01J 27/00* (2006.01)
(52) U.S. Cl. .................... 250/423 R; 250/424; 250/425; 250/426; 250/427; 250/423 P; 250/423 F
(58) Field of Classification Search ............. 250/423 R, 250/424, 425, 426, 427, 423 P, 423 F
See application file for complete search history.

(56) References Cited

U.S. PATENT DOCUMENTS

| 6,768,119 | B2 | 7/2004 | de la Mora et al. |
| 7,199,364 | B2 | 4/2007 | Thakur |

OTHER PUBLICATIONS

Lozano, P. and Martinez-Sanchez, M., "Ionic Liquid Ion Sources: Suppression Of Electrochemical Reactions Using Voltage Alternation," Journal of Colloid and Interface Science, vol. 280, No. 1 (2004), pp. 149-154.

Lozano, P. and Martinez-Sanchez, M., "Ionic Liquid Ion Sources: Characterization of Externally Wetted Emitters," Journal of Colloid and Interface Science, vol. 282, No. 2(2005), pp. 415-421.

Taylor, G.I., "Disintegration Of Water Drops In An Electric Field," Proc. R. Soc. A, vol. 280 (1964), pp. 383-397.

Clampitt, R. et al, "Intense Field-Emission Ion Source of Liquid Metals," Journal of Vacuum Science and Technology, vol. 12, No. 1 (1975) p. 1208.

Tseng, A., "Recent Developments in Nanofabrication Using Focused Ion Beams", Small, vol. 1, No. 10 (2005), pp. 924-939.

Escher, C. et al., "Vacuum Ion Emission From Solid Electrolytes: An Alternative Source For Focused Ion Beams," Applied Physics Letters, vol. 89 (2006) 053513-1 and 053513-2.

Scipioni, L. et al, "Performance of Multicusp Plasma Ion Source For Focused Ion Beam Applications," Journal of Vacuum Science and Technology B, vol. 18, No. 6 (2000), pp. 3194-3197.

Smith, N.S., et al., "High-Brightness Inductively Coupled Plasma Source For High Current Focused Ion Beam Applications," Journal of Vacuum Science and Technology B, vol. 24, No. 6 (2006), pp. 2902-2906.

(Continued)

*Primary Examiner*—Jack I Berman
*Assistant Examiner*—Hanway Chang
(74) *Attorney, Agent, or Firm*—Proskauer Rose LLP

(57) ABSTRACT

An apparatus for producing negative ions including an emitter coated with an ionic liquid room-temperature molten salt, an electrode positioned downstream relative to the emitter, a power supply that applies a voltage to the emitter with respect to the electrode. The power supply is sufficient to generate a stable high brightness beam of negative ions having minimal chromatic and spherical aberrations in the beam. An electrostatic lens and deflector is used to focus and direct the beam to a target.

20 Claims, 10 Drawing Sheets

OTHER PUBLICATIONS

Guharay, S.K. et al, "Characteristics Of Focused Beam Spots Using Negative Ion Beams From A Compact Surface Plasma Source And Merits For New Applications," Journal of Vacuum Science and Technology B, vol. 16, No. 6 (1998), pp. 3370-3373.

Velasquez-Garcia, L. et al., "A Planar Array Of Micro-Fabricated Electrospray Emitters For Thruster Applications," Journal of Microelectromechanical Systems, vol. 15, No. 5 (Oct. 2006), pp. 1272-1280.

Romero-Sanz, I. et al., "Source of Heavy Molecular Ions Based On Taylor Cones Of Ionic Liquids Operating In The Pure Ion Evaporation Regime," J. Appl. Phys., vol. 94, No. 5 (2003), pp. 3599-3605.

Lozano, P. and Martinez-Sanchez, M., "On The Dynamic Response Of Externally Wetted Ionic Liquid Ion Sources," J. Phys. D: Appl. Phys., vol. 38, No. 14 (2005), pp. 2371-2377.

Larriba, C. et al., "Monoenergetic Source Of Kilodalton Ions From Taylor Cones Of Ionic Liquids," Journal of Applied Physics, No. 101 (2007), pp. 084303-1 to 084303-6.

Lozano, P., "Energy Properties Of An EMI-IM Ionic Liquid Ion Source," J. Phys. D: Appl. Phys., vol. 39 (2006), pp. 126-134.

Prewett, P.D. and Mair, G.L.R., "Focused Ion Beams From Liquid Metal Ion Sources," Research Studies Press (1991), pp. 19-30, 78-101 and 151-174.

Szilagyi, M., Electron and Ion Optics, Plenum Press (1988), pp. 216-250 and 251-263.

Driesel, W., et al., "In Situ Observation of The Tip Shape of Auge Liquid Alloy Ion Sources Using a High Voltage Transmission Electron Microscope," J. Vac. Sci. Technol. B, vol. 14, No. 5 (1996), pp. 3367-3380.

Guzdar, P.N. et al., "Charging of substrates irradiated by particle beams," Applied Physics Letters, vol. 71, No. 22 (1997), pp. 3302-3304.

Suzuki, T. et al., "Contrast Differences Between Scanning Ion and Scanning Electron Microscope Images," Journal of Vacuum Science and Technology A, vol. 22, No. 1 (2004), pp. 49-52.

Y. Chiu, D. et al., "Mass Spectrometric Analysis of Colloid Thruster Ion Emission From Selected Propellants," Journal of Propulsion and Power, vol. 21, No. 3 (2005), pp. 416-423.

P. Lozano, et al., "Electrospray Emission From Nonwetting Flat Dielectric Surfaces," Journal of Colloid and Interface Science, vol. 276, No. 2 (2004), pp. 392-399.

P. Lozano, et al., "Performance Characteristics of a Linear Ionic Liquid Electrospray Thruster," IEPC-2005-192, 29th International Electric Propulsion Conference, Princeton University (USA), Oct. 21-Nov. 2005, pp. 1-6.

P. Lozano and M. Martinez-Sanchez, "Experimental Measurements of Colloid Thruster Plumes in the Ion-Droplet Mixed Regime," (AIAA-3814) 38th Joint Propulsion Conference, Jul. 7-10, 2002, Indianapolis, Indiana, pp. 1-7.

X.F. He, et al., "Magnetic and Photomagnetic Properties of Polycrystalline Wide-Gap Semiconductor $Cd_{1-x}Mn_xTe$ Thin Films," Journal of Electronic Materials, vol. 26 No. 2 (1997), pp. 73-77.

J. Carretero, et al., "Numerical Simulation of Taylor Cone-Jets and Colloid Thruster Plumes," $4^{th}$ International Conference on Spacecraft Propulsion, Cagliari (Italy), Jun. 2-4, 2004.

Swanson et al, "Emission Characteristics of Gallium and Bismuth Liquid Metal Ion Sources", J. Vac Sci. Technol., vol. 16, No. 6 (1979), pp. 1864-1869.

Muhle et al. "A Time-Of-Flight Spectrometer for Investigations on Liquid Metal Ion Sources," J Phys. D: Appl. Physics, vol. 32, No. 2 (1999), pp. 161-167.

Cleaver, J., et al., "A 100-Kv Ion Probe Microfabrication System With a Tetrode Gun," Vacuum Sci & Technol., vol. 19, No. 4 (1981), pp. 1145-1148.

McEwen A.B. et al., "Electrochemical Properties of Imidazolium Salt Electrolytes for Electrochemical Capacitor Applications", J. Electrochem. Soc., vol. 146, No. 5 (1999), pp. 1687-1695.

Li, Jian, "The Focused-Ion-Beam Microscope—More than a Precision Ion Milling Machine," JOM, vol. 58, No. 3 (2006), pp. 27-31.

FOCUSED NEGATIVE ION BEAM FIELD SOURCE

CROSS-REFERENCE TO RELATED APPLICATION

This application claims the benefit of and priority to U.S. provisional patent application 60/942,846 filed on Jun. 8, 2007, which is owned by the assignee of the instant application and the disclosure of which is incorporated herein by reference in its entirety.

GOVERNMENT SUPPORT

The subject matter described herein was supported in part by the Air Force Office of Scientific Research, Contract No. F49620-01-1-398. The U.S. Government has certain rights in this technology.

FIELD OF THE TECHNOLOGY

The technology generally relates to devices and methods of generating ions to a target. In particular, the technology relates to an apparatus to generate a stable beam of negative ions having minimal aberrations in the beam.

BACKGROUND OF THE INVENTION

Ionic liquids are used in ionic liquid ion sources. Ionic liquid ion sources are impregnated with solvent-free ionic liquids, also known as room temperature molten salts. Ionic liquids are composed of non-solvent mixtures of complex organic and inorganic cations and anions. The surface tension of ionic liquids are similar to typical organic liquids. These ions are large enough to produce a poorly coordinated mixture that remains in the liquid phase at moderate temperatures. Some of them display super-cooling tendencies in which they remain as liquids well below their nominal freezing points. Just as their inorganic cousins (i.e., simple salts such as NaCl, KBr, etc.) at their melting points (typically >850° C.), they exhibit appreciable electrical conductivity at room temperature, making them suitable for electrostatic deformation and subsequent Taylor cone formation. Ionic liquids are thermally stable over a wide range of temperatures (i.e., they do not boil, but decompose at temperatures ~250-500° C.) and are apparently non-toxic being able to be used with applications with green standards, such as in the synthesis and catalysis of chemical reactions. Ionic liquids also can be used in electrochemical systems, such as in high energy density super-capacitors. The attractiveness in this area relies on the size of their electrochemical window (i.e., the maximum potential difference sustainable by the liquid before electrochemical reactions are triggered), which is higher than in conventional aqueous solutions. In addition to these characteristics, ionic liquids have the important property of having extraordinarily low vapor pressures at, or moderately above, their melting points. This allows them to be used in high vacuum equipment in open architectures such as liquid-impregnated needles.

There are a large number of ionic species and compositions. Ionic liquids have favorable electrochemical properties. For example, it is possible with ionic liquid ion sources to extract nearly monochromatic positive or negative ion beams from a nanometer-sized liquid source. In contrast to other organic solutions, it is possible with ionic liquids to achieve a regime where only ions are electro-sprayed. These characteristics are ideal for precision focused ion beam applications (e.g., microscopy and analysis, lithography, implantation, etching, microelectronics mask repair, plasma contactor, space propulsion, etc). Of relevance is the introduction of a compact, relatively simple source of negative ions. Negative ions have the potential to eliminate problems associated with charge build-up on dielectric or electrically floating substrates. These problems range from limiting the focusing capabilities of the focused ion beam system to surface damage due to differential charging. In addition, negative ions from some ionic liquids are chemically reactive, potentially enhancing the etching rates without recurring to chemical assistance.

Ionic liquid ion sources can be unique in producing high-brightness emission of complex organic and inorganic molecular ions. Ionic liquid ion sources are able to produce positive or negative ion beams with ideal characteristics for focused ion beam applications: (1) narrow energy distributions, (2) high brightness, (3) small source size, and (4) wide selection of liquids with very diverse molecular compositions. Ionic liquid ion sources can be used as a simple and compact source of nearly-monoenergetic negative ions, which could reduce considerably the charge build-up that limits the ability to focus non-neutralized positive ion beams onto dielectrics (insulators or some biological samples) or conductive, but electrically floating targets, and act as a chemically reactive etch agent for materials micro- and nano-processing applications. The dependencies of beam spot size down to the nanometer level can be determined as a function of column operating parameters and geometry. Nano-scale beam spots allow for higher resolution in focused ion beam applications (e.g., in microscopy and ion lithography). Resolution, together with the source brightness, is a desirable property of an ion source applicable to nanotechnology.

Implementation of ionic liquid ion sources for focused ion beam applications can have a broader impact on, for example, the preparation of samples for transmission electron microscopy (TEM) when used as a milling tool, in high-resolution ion microscopy of a variety of conductive (electrically floating, biased or grounded) and non-conductive specimens, in ion lithography and implantation, among others. Ionic liquid ion sources can also be used in the analysis of biological samples due to favorable optical properties of negative beams when interacting with non-metallic substrates. Ionic liquid ion sources can be used with chemically reactive negative ion beams for etching applications (for instance, $BF_4-$). Current practice with positive ions utilize the injection of a reactive species (e.g., $Cl_2$ gas, for example) to enhance the rate of material removal. Avoiding that practice would be beneficial in the operation of UHV systems.

An existing ionic source includes a Liquid Metal Ion Source, which uses a liquid metal. Except for metals such as In or Ga, most sources work only at very high temperatures, thus introducing some difficulties in the source implementation, as the thermal evaporation rate of neutrals increases and chemical reactions with the needle material (e.g., tungsten) may occur. These thermal and compatibility issues mean that only a relatively small number of metallic elements and alloys can be successfully used in liquid metal ion sources. In addition, operation with liquid metals can be possible only in the positive polarity, thus emitting positively charged metallic ion beams.

Another existing ionic source includes capillary-based electrosprays, which includes a capillary tube. An example of such an electrospray is described in U.S. Pat. No. 7,199,364 entitled "Electrospray ion source apparatus" by Thakur. Capillary based electrosprays can be used to produce highly charged micro and nano-droplet beams. The flow of ionic liquids used in capillary emitters are controlled by line hydraulics, back pressure and/or applied voltage to the emitter. Bubbles and small particles can be problematic with these this type of electrospray. Droplets, however, may not give enough fuel efficiency as a thruster to be competitive with other forms of propulsion. The specific charge of emitted species can be increased by increasing the liquid conductivity and decreasing the supply flow rate, however, some ionic solutions (e.g., Formamide saturated with NaI) exhibit copious ion emission but most of the mass is still emitted as droplets, decreasing the thruster efficiency. In contrast, bubbles and liquid starvation (e.g., vapor lock) is less likely with ionic liquid ion sources.

SUMMARY OF THE INVENTION

In one aspect, the invention includes an apparatus for producing negative ions. The invention includes an emitter coated with an ionic liquid room-temperature molten salt. An electrode is positioned downstream relative to the emitter. A power supply applies a voltage to the emitter with respect to the electrode, sufficient to generate a stable high brightness beam of negative ions having minimal chromatic and spherical aberrations in the beam. An electrostatic lens and a deflector focuses and directs the beam to a target.

In another aspect, the invention includes a method for providing negative ions. An outer surface of an emitter is coated with an ionic liquid room-temperature molten salt. A voltage (e.g, negative voltage) is applied to the emitter with respect to a downstream aperture, sufficient to generate a stable high brightness beam of negative ions having minimal chromatic and spherical aberrations in the beam. The beam of negative ions is focused and directed to a target.

In yet another aspect, the invention includes a method of providing ions to at least one of a biological, or dielectric, or electrically floating conductive substrate. An outer surface of an emitter is coated with an ionic liquid room-temperature molten salt. The ionic liquid is stored inside a metallic cylinder mounted on a dielectric enclosure. The metallic cylinder is used as a diagnostic probe. A negative voltage is applied to the emitter with respect to an aperture to generate a beam of negative ions having minimal aberrations in the beam. The beam of negative ions is focused and directed to at least one of a biological, or dielectric, or electrically floating, biased or grounded conductive substrate.

In another aspect, the invention includes an apparatus for producing negative ions including an array of emitters coated with an ionic liquid room-temperature molten salt wherein the individual emitters are operated in parallel. An electrode is positioned downstream relative to the emitter array. A power supply applies a voltage to the emitter array with respect to the electrode, sufficient to generate a stable high brightness beam of negative ions having minimal chromatic and spherical aberrations in the beam. Each individual emitter provides a current of about 0.01-10 micro-Amps in the beam. An electrostatic lens and deflector focuses and directs the beam to a target.

In other examples, any of the aspects above, or any apparatus or method described herein, can include one or more of the following features.

In some embodiments, the emitter is mounted on a dielectric enclosure. A cylinder can be mounted on the dielectric enclosure to store the ionic liquid. In some embodiments, the cylinder is a diagnostic probe. The cylinder can be metallic and can be made of a conductive and non-corrosive material, such as stainless steel.

In some embodiments, the emitter generates a current of about 0.01-10 micro-Amps in the high brightness beam of negative ions having minimal aberrations. One or more emitters can be operated in parallel to generate higher currents in the high brightness beam. In some embodiments, the power supply applies a voltage to the emitter sufficient to generate the current of about 0.01-10 micro-Amps in the high brightness beam of negative ions. Generating a current of about 0.01-10 micro-Amps can generate a beam having minimal aberrations.

The power supply can apply a voltage of the opposite polarity to the emitter with respect to a downstream aperture, to generate a high brightness beam of positive ions with minimal chromatic and spherical aberrations.

In some embodiments, the target is at least one of a biological, or dielectric, or electrically floating conductive substrate. The beam can be directed to implant a substance in a micro-electronic device. In some embodiments, the beam of negative ions is directed to a target to generate a pattern on a target. The beam of negative ions can be directed to a target to scan the surface of a target and reconstruct a high resolution image of the surface via secondary emission.

Other aspects and advantages of the invention can become apparent from the following drawings and description, all of which illustrate the principles of the invention, by way of example only.

BRIEF DESCRIPTION OF THE DRAWINGS

The advantages of the invention described above, together with further advantages, may be better understood by referring to the following description taken in conjunction with the accompanying drawings. The drawings are not necessarily to scale, emphasis instead generally being placed upon illustrating the principles of the invention.

DETAILED DESCRIPTION OF THE INVENTION

Figure 1:
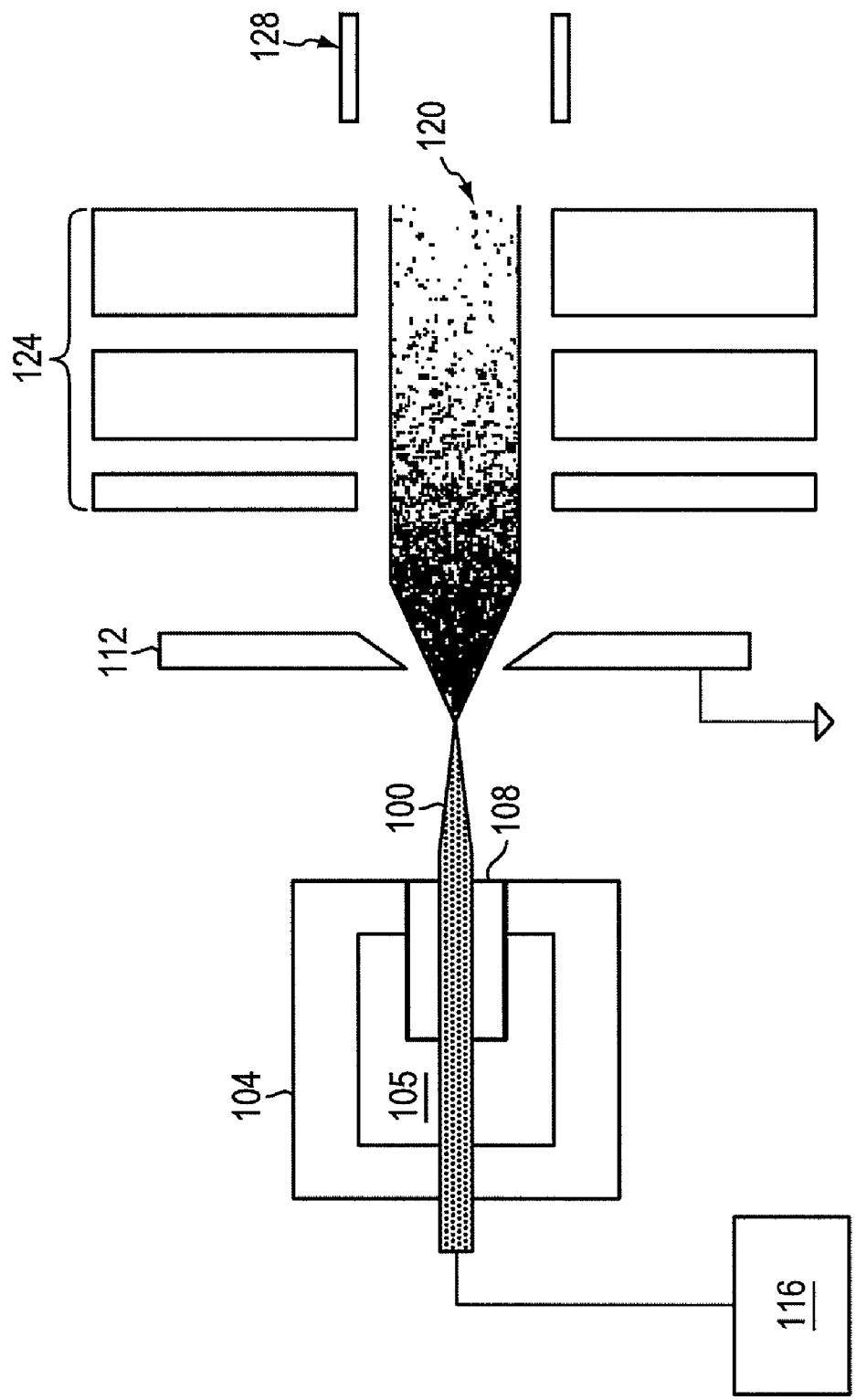
FIG. 1 is a schematic of a focused negative ion beam source, according to an illustrative embodiment of the invention.

FIG. 1 is a schematic of a focused negative ion beam source, according to an illustrative embodiment of the invention. A negative ion beam source can include an emitter 100 coated (e.g., externally wetted) with an ionic liquid room-temperature molten salt, an electrode 112 positioned downstream relative to the emitter 100 and a power supply 116 that applies a voltage to the emitter 100 with respect to the electrode 112, sufficient to generate a stable high brightness beam 120 of negative ions (e.g., negative ions or a substantially monoenergetic heavy ion beam) having minimal chromatic and spherical aberrations in the beam. The ion source can also include an electrostatic lens 124 and a deflector 128 to focus and direct the beam 120 to a target.

The emitter 100 can be mounted on a dielectric enclosure 104. In some embodiments, the dielectric enclosure 104 is made of plastic or a ceramic. In this embodiment, the dielectric enclosure 104 includes a vacuum 105. A cylinder 108 (e.g., solid hollow cylinder) can be mounted on the dielectric enclosure 104. The ionic liquid (e.g., $EMI-BF_4$) that coats the emitter 100 can be stored inside the cylinder 108. In some embodiments, the cylinder 108 can be a diagnostic probe. In some embodiments, the cylinder 108 can be connected to a high impedance electrometer for electrical diagnostic purposes. In some embodiments, the cylinder 108 is made of a conductive and non-corrosive material, such as stainless steel.

The configuration as described in FIG. 1 is much simpler (e.g., as compared to capillary based electrospray emitters) as no pressurization system is required and control is passively achieved with the applied voltage alone via external wetting of ionic liquids on the emitter 100. The emitter 100 is also exposed to a greater amount of ionic liquid as compared to existing designs (e.g., capillary-based electrosprays). A larger number of ionic liquids can be used (e.g., as compared with liquid metals) and also can be used in a negative polarity to emit negative ions (e.g., as compared with liquid metal sources which can only be operated in a positive polarity). Mere application of an ionic liquid in a typical liquid metal ion source needle, however, will not result in a functioning ion source. The physical properties of liquid metals are very different from ionic liquids, and the emitter (e.g., emitter 100) reflects those differences. For example, electrochemistry is a factor in ionic liquid ion sources. In contrast, electrochemistry is not a factor in liquid metal ion sources. Furthermore, ionic liquid ion sources do not require heating.

The emitter 100 can be a solid emitter made from tungsten. In some embodiments, the emitter 100 is made from a non-refractory metal. In some embodiments, the emitter 100 is formed from electrochemical sharpening and chemical treatment can be used to improve wetting. Annealing the material used to form the emitter 100 can align grain boundaries. In some embodiments, the emitter 100 can be a grooved needle configuration, where liquid flows inside grooves aligned with the emitter. If the tip of the emitter 100 is smooth, the emitter 100 may not sustain a liquid film in equilibrium.

In some embodiments, the power supply 116 applies a voltage to emitter 100 that generates a current of about 0.01-10 micro-Amps in the high brightness beam 120 of negative ions having minimal aberrations. The beam 120 may, in some cases, experience in-flight fragmentation. Some of the heaviest ions in the beam 120 are unstable and breakup into smaller ions during flight, which can change the energy properties of the beam and introduce a lower energy population that would increase the chromatic aberration of the system. A possible solution is to use an energy band-pass filter. In some embodiments, the electrostatic lens 124 can be used as a bandpass filter. The electrostatic lens 124 can focus to a point only one particularly narrow energy band, scattering away particles with different energies.

In some embodiments, the distance between a tip of the emitter 100 and electrode 112 can be within a distance comparable to a few emitter (e.g., needle) diameters. In some embodiments, the needle tip is coplanar with the extractor face (distance=0) and when moved back the needle tip is kept within 1 mm from the extractor face. Applying a voltage to the emitter 100 with respect to the electrode 112 results in an electrostatic traction over the ionic liquid film. When the electrostatic traction is higher than the surface tension of the liquid film covering the emitter 100, the surface of the ionic liquid becomes unstable. The instability evolves into a dynamically stable conical structure known as a Taylor cone. The zero-th order equilibrium condition at the liquid surface can cause the electric field to intensify towards the cone apex. Given the very small sizes of the apex (atomic sized), the electric field becomes on the order of about 1 V/nm. Such values can be intense enough to trigger field evaporation of metallic ions 120 directly from the liquid surface after overcoming the surface activation barrier, which includes image charge binding forces. The current density can be evaporated from the meniscus grows exponentially with the field, which allows the ionic source to achieve high brightness. In addition, the source region is very well localized, so that ions are generated with small energy deficits and narrow energy distributions. The ionic liquid flow rate to the tip is controlled by factors such as surface roughness and the voltage applied to the emitter 100. When the voltage is off, liquid can recede into grooves closest to tip of the emitter 100. Application of higher voltages by the power supply 116 can produce more electrostatic traction over the ionic liquid (i.e., generating a Taylor cone), but can also result in increased channel drying rates (i.e., which can lead to liquid starvation of the emitter). In some embodiments, the power supply 116 applies a voltage sufficient to generate a current approximately 0.01-10 micro-Amps in the beam 120 (e.g., high brightness beam) of negative ions. In some embodiments, the power supply 116 applies a voltage of the opposite polarity to the emitter 100 to generate a beam (e.g., high brightness beam) of positive ions with minimal chromatic and spherical aberrations.

In some embodiments, a method for providing negative ions includes coating an outer surface of an emitter 100 with an ionic liquid room-temperature molten salt and applying a voltage to the emitter 100 with respect to an electrode 112 (e.g., downstream aperture), sufficient to generate a beam 120 (e.g., stable high brightness beam) of negative ions having minimal chromatic and spherical aberrations in the beam 120. The method can also include focusing the beam of negative ions and directing the beam 120 of negative ions to a target. In some embodiments, the method can include the step of applying a voltage of the opposite polarity to the emitter 100 with respect to a downstream aperture, sufficient to generate a high brightness beam of positive ions with minimal chromatic and spherical aberrations. Applying the voltage sufficient to generate a beam 120 having minimal aberrations can include generating a current of about 0.01-10 micro-Amp in the beam 120. In some embodiments, the target is at least one of a biological, or dielectric, or electrically floating, biased or grounded conductive substrate. In some embodiments, the beam 120 can be directed to implant a substance in a microelectronic device. A beam 120 of negative ions can also be directed to generate a pattern on a target. A beam 120 of negative ions can be directed to scan the surface of a target and reconstruct a high resolution image of the surface via secondary emission. In some embodiments, the ionic liquid can be stored inside a cylinder 108 (e.g., metallic cylinder) mounted on a dielectric enclosure 104 and the metallic cylinder is used as a diagnostic probe.

In some embodiments, a method of providing ions to at least one of a biological, or dielectric, or electrically floating conductive substrate includes coating an outer surface of an emitter 100 with an ionic liquid room-temperature molten salt, storing the ionic liquid inside a cylinder 108 (e.g., metallic cylinder) mounted on a dielectric enclosure 104 and using the metallic cylinder as a diagnostic probe. The method can also include applying a negative voltage to the emitter 100 with respect to an aperture to generate a beam 120 of negative ions having minimal aberrations in the beam 120, focusing the beam 120 of negative ions and directing the beam 120 of negative ions to at least one of a biological, or dielectric, or electrically floating, biased or grounded conductive substrate.

The thrust of a single emitter 100 (e.g., a needle emitter) can range from approximately 0.01 $\mu$N to approximately 0.1 $\mu$N. In some embodiments, a plurality or an array of emitters can be used and can be disposed at varying locations with respect to the other emitters. In some embodiments, one or more emitters (e.g., the emitter 100) are operated in parallel to generate higher currents in the high brightness beam 120. In some embodiments, an apparatus for producing negative ions can include an array of emitters coated with an ionic liquid room-temperature molten salt wherein the individual emitters are operated in parallel. An electrode 112 can be positioned downstream relative to the emitter array and a power supply 116 that applies a voltage to the emitter array with respect to the electrode 112 sufficient to generate a stable high brightness beam 120 of negative ions having minimal chromatic and spherical aberrations in the beam 120, wherein each individual emitter provides a current of about 0.01-10 micro-Amps in the beam 120. An electrostatic lens 124 and deflector 128 can be used to focus and direct the beam 120 to a target. The emitters can also be distributed over a two dimensional surface. A plurality of emitters can be manufactured using Silicon. Emitters having a tip separation of approximately 100 $\mu$m to 500 $\mu$m have been demonstrated, although it is contemplated that a smaller tip separation is possible. The separation distance between emitters is limited by the electrode 112 (e.g., extractor). A hydrophobic surface enhances liquid transport rates, therefore maximizing current levels per emitter.

In some embodiments, the ion beam source is in a "hairpin" configuration, where the emitter 100, is mounted relative to a structural wire which acts as the dielectric enclosure 104. The intersection between the structural wire and the emitter 100 (e.g., which can be shaped as a needle) holds the ionic liquid. The tip of the emitter 100 can be electrically biased with respect to the electrode 112 (e.g., extractor aperture), thus producing the ion beam 120. In some embodiments, the emitter 100 is a needle that is externally wetted, which is possible due to the extremely low volatility exhibited by ionic liquids.

The size of the cylinder 108 can be selected such that surface tension forces are stronger than gravitational forces and the ionic liquid rests unperturbed inside the cylinder 108. The length of the cylinder 108 can be selected according to the amount of ionic liquid to be stored. The length of the cylinder 108 can be about 1.5 mm to about 12.7 mm. In some embodiments, a cylinder 108 with a shorter length can perform better than a cylinder with a longer length. The cylinder 108 can be made of a conductive material that resists corrosion. In some embodiments, the cylinder 108 is metallic and is a stainless-steel cylinder that serves as an electric probe, ionic liquid reservoir and heat sink. The cylinder 108 can be used to measure electrical properties in the ionic liquid to diagnose the electrochemistry. In some embodiments, the floating probe can be used to measure electrical properties in the ionic liquid. The voltage of the probe can be measured with respect to the emitter to determine how the liquid voltage changes with respect to the emitter.

Figure 2:
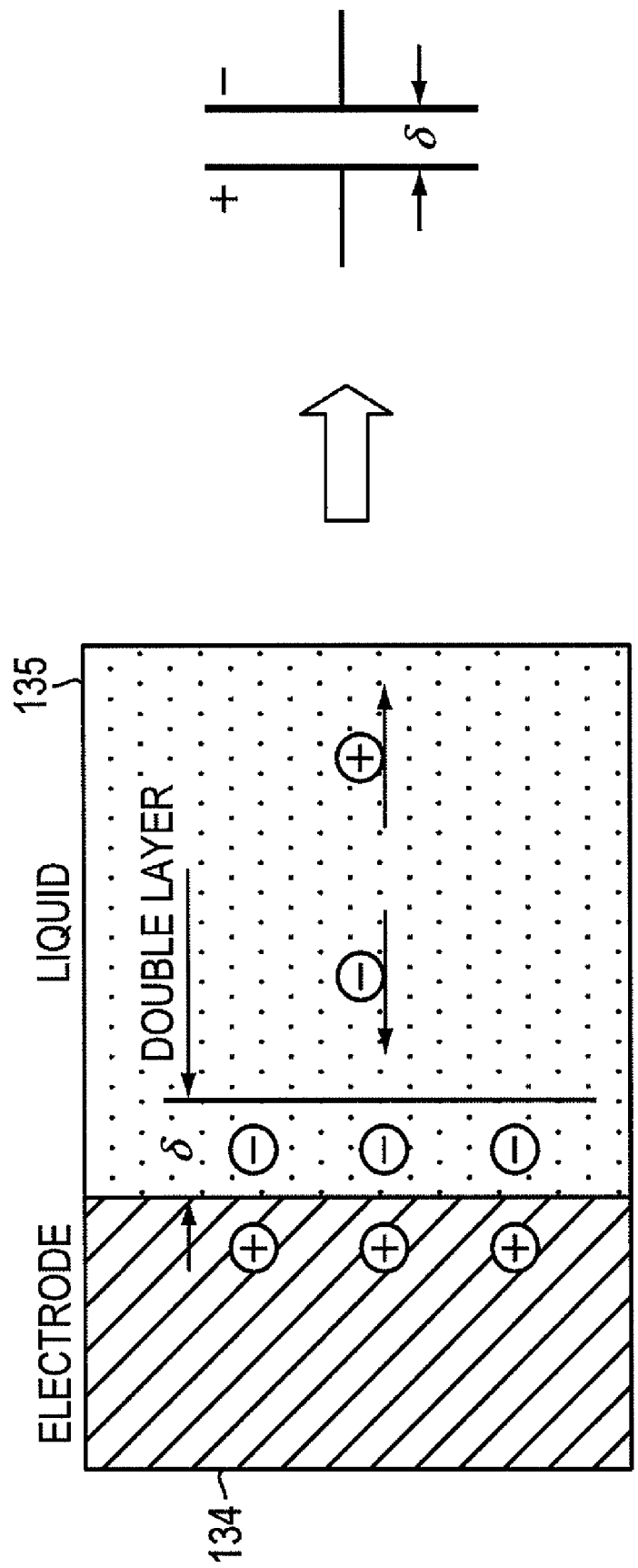
FIG. 2 depicts a model of an electrode relative to an ionic liquid surface, according to an illustrative embodiment of the invention.

FIG. 2 is a schematic of an emitter electrode-liquid interface (e.g., an emitter as described above in FIG. 1) and ionic liquid 135 coating the emitter, according to an illustrative embodiment. The emitter-ionic liquid interface can be modeled as a capacitor when only one polarity is extracted. Externally wetted emitters working in the pure ionic regime (e.g., such as those described above in FIG. 1) suffer from fouling after a few hours. For example, an emitter that operates to emit positive ions after 5 hours can suffer from decomposition. As ions are extracted from the source, ions of the opposite polarity migrate to the emitter surface thus creating a charged double-layer. As these ions accumulate on the surface, the potential difference across the double-layer could become larger than the electrochemical window limit for liquid decomposition, thus triggering electrochemical reactions. Fouling of the source depends on the nature of these electrochemical reactions. For instance, EMI+ ions deposited on the source evolve as a gas without further emitter (e.g., needle) deterioration. In contrast, BF4– ions form a dielectric layer destroying the source ability to emit ions.

It was found that electrochemical reactions could be avoided if the charging time of the double-layer 140 structure that forms over the emitter surface-liquid interface is long enough to actively stop its growth. This depends on the magnitude of the potential difference across the double layer 140 for electron transfer (the electrochemical window) and the system capacitance. The charging time is based, at least in part by the emitted current, the liquid contact area and the electrical properties of the liquid. For example, for an ionic liquid source including a solid emitter with a length of 3 mm and a diameter of 254 $\mu$m, the charging time was found to be approximately 10 seconds. This time is relatively large because (1) the effective separation of the charged layers in the capacitor model is atomic sized, and (2) the capacitor area is as large as the liquid contact area with the emitter (e.g., needle). The last point is only possible if the charge diffusion rates from the emitter tip are fast enough, which is the case given the liquid film thickness and the electrical conductivity. Before the voltage reaches the critical value for decomposition, the polarity of the power supply is reversed to discharge the effective capacitor that forms the double layer 140 while creating a new one with the opposite charge. The electrochemical window of ionic liquids 135 is 2-3 times larger than in aqueous solutions, so the alternation frequency of ionic liquids 135 is lesser than those for aqueous solutions. Clean emission was demonstrated for at least ~200 hours with a frequency of 1 Hz for emitters coated with an ionic liquid. Emitters have been operated at extended periods of time (>100 hr) at frequencies as low as 0.3 mHz.

Figure 3B:
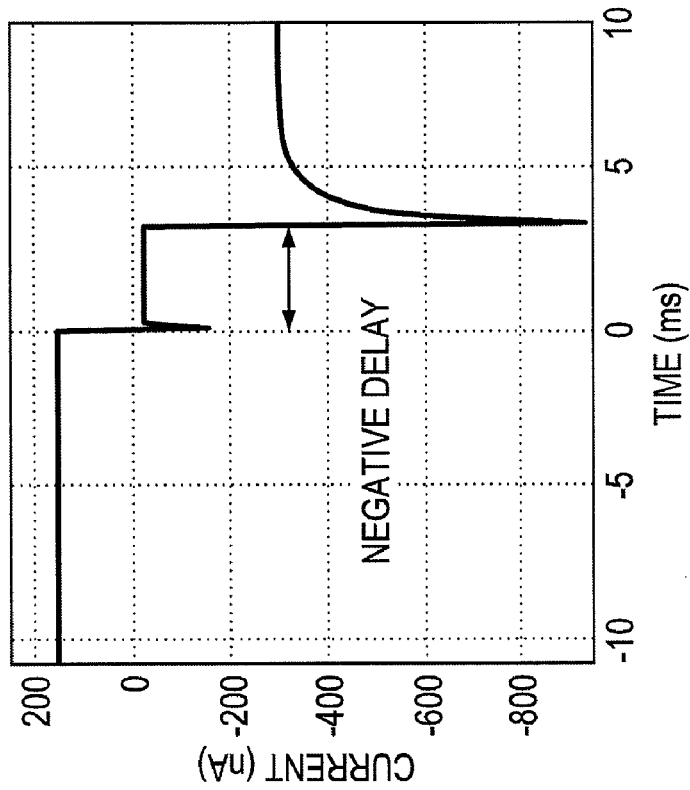
FIG. 3B shows start-up delays when an ion source is operating in a negative mode, according to an illustrative embodiment of the invention
Figure 3A:
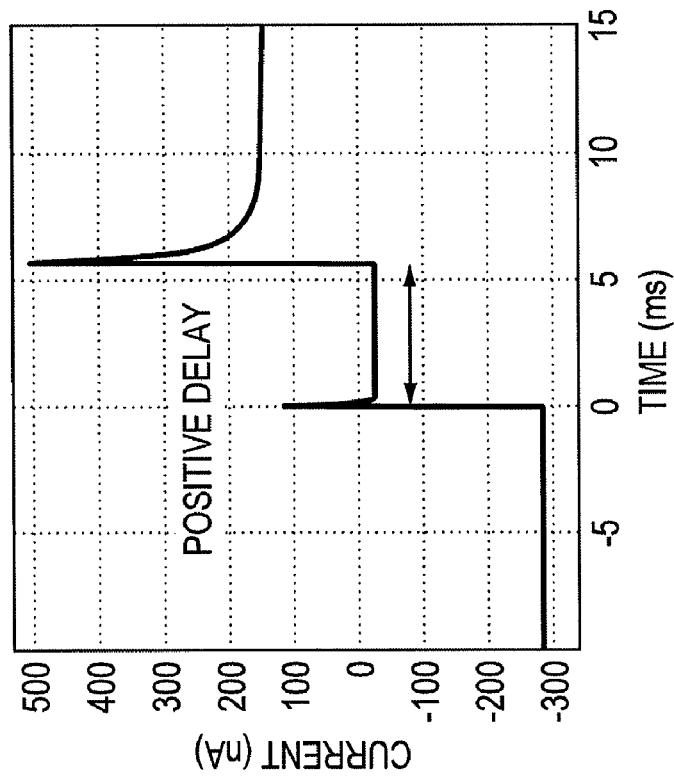
FIG. 3A shows start-up delays when an ion source is operating in a positive mode, according to an illustrative embodiment of the invention

FIGS. 3A and 3B show start-up delays when an ion source is operating in alternating mode, according to an illustrative embodiment of the invention. In some embodiments, there is a period of time (i.e., "start-up delay") between the alternation of voltage on the emitter (e.g., emitter 100 as described above in FIG. 1) and generation of current in the beam. It is possible to minimize start-up delays by increasing the voltage applied to the emitter. The start-up delays are much shorter than the voltage signal period, even at frequencies as large as 10 Hz, and therefore do not contribute significantly to the beam dynamics.

Figure 4A:
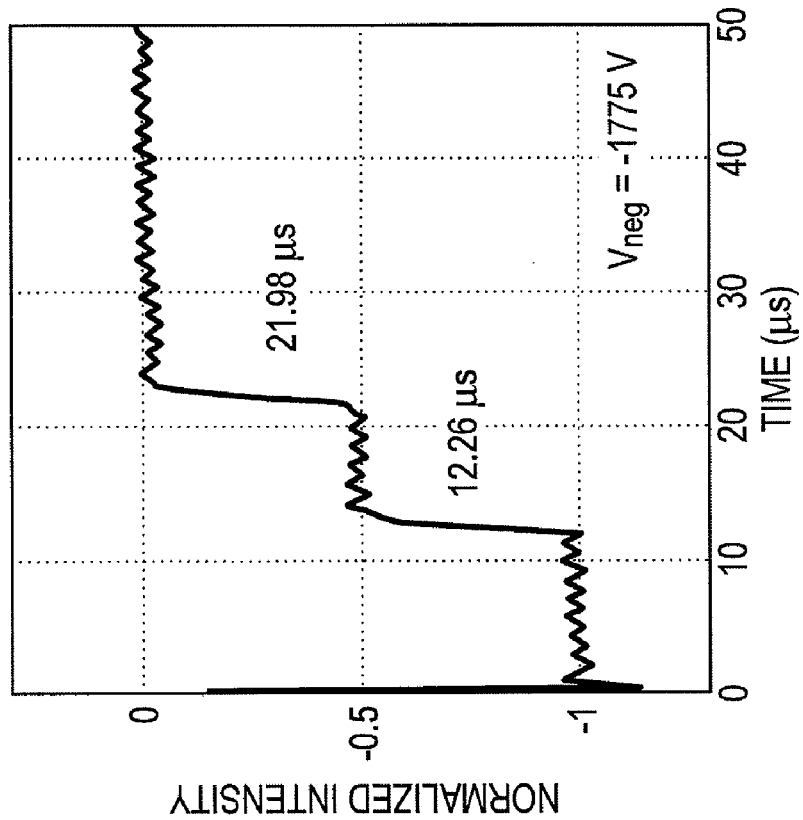
FIG. 4A is a graph showing a normalized intensity of a positive ion beam current generated by an ion source in a time-of-flight spectrometer, according to an illustrative embodiment of the invention.
Figure 4B:
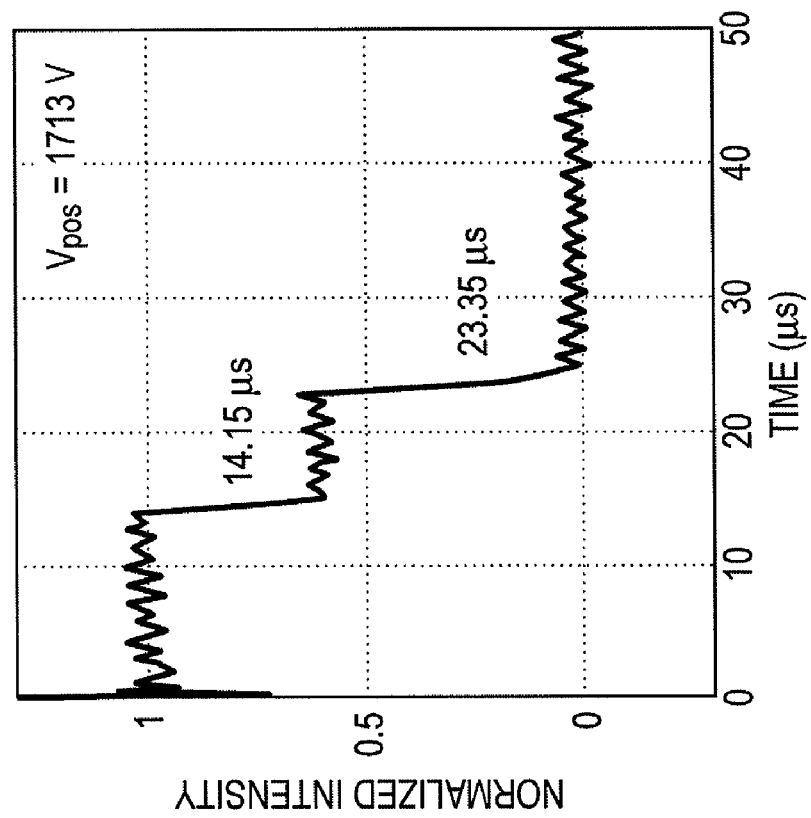
FIG. 4B is a graph showing a normalized intensity of a negative ion beam current generated by an ion source in a time-of-flight spectrometer, according to an illustrative embodiment of the invention.

FIGS. 4A and 4B shows the time of flight for positive and negative ions, according to an illustrative embodiment of the invention. In this embodiment, an emitter configuration similar to that described above in FIG. 1 was used using an ionic liquid EMI-BF$_4$ was tested. FIGS. 4A and 4B show the normalized intensity of the beam generated by the emitter (y-axis) as a function of time (x-axis). In this embodiment, the emitter(s) that were tested were electrochemically sharpened and surface-roughened tungsten needles about 0.5 mm in diameter which were coated with the ionic liquid EMI-BF$_4$.

FIG. 4A shows the time of flight spectroscopy for EMI+ and (EMI-BF$_4$)EMI+ ions with molecular masses of 111 and 309 amu respectively, that were emitted in the positive cycle at an extraction voltage of −1713V. FIG. 4B shows that negative ions BF$_4$— and (EMI-BF$_4$)BF$_4$— with masses 87 and 285 amu were emitted in the negative mode at an extraction voltage of −1775V. The currents of both beams were very close to ±200 nA at a voltage of approximately ±1.8 kV. From the shape of the spectroscopic distributions, it was inferred that these ions were emitted with energies close to their respective extraction potentials.

Experiments showed that variations in the magnitude of the extraction voltage produced more or less linear excursions of current with a slope of about 0.5 nA/V. These excursions were limited by the minimum voltage to produce ion emission and the maximum voltage at which stable emission was obtained (a range of ~500V with that configuration). The maximum voltage is defined by the point where an emitter suffers from liquid starvation.

Figure 5:
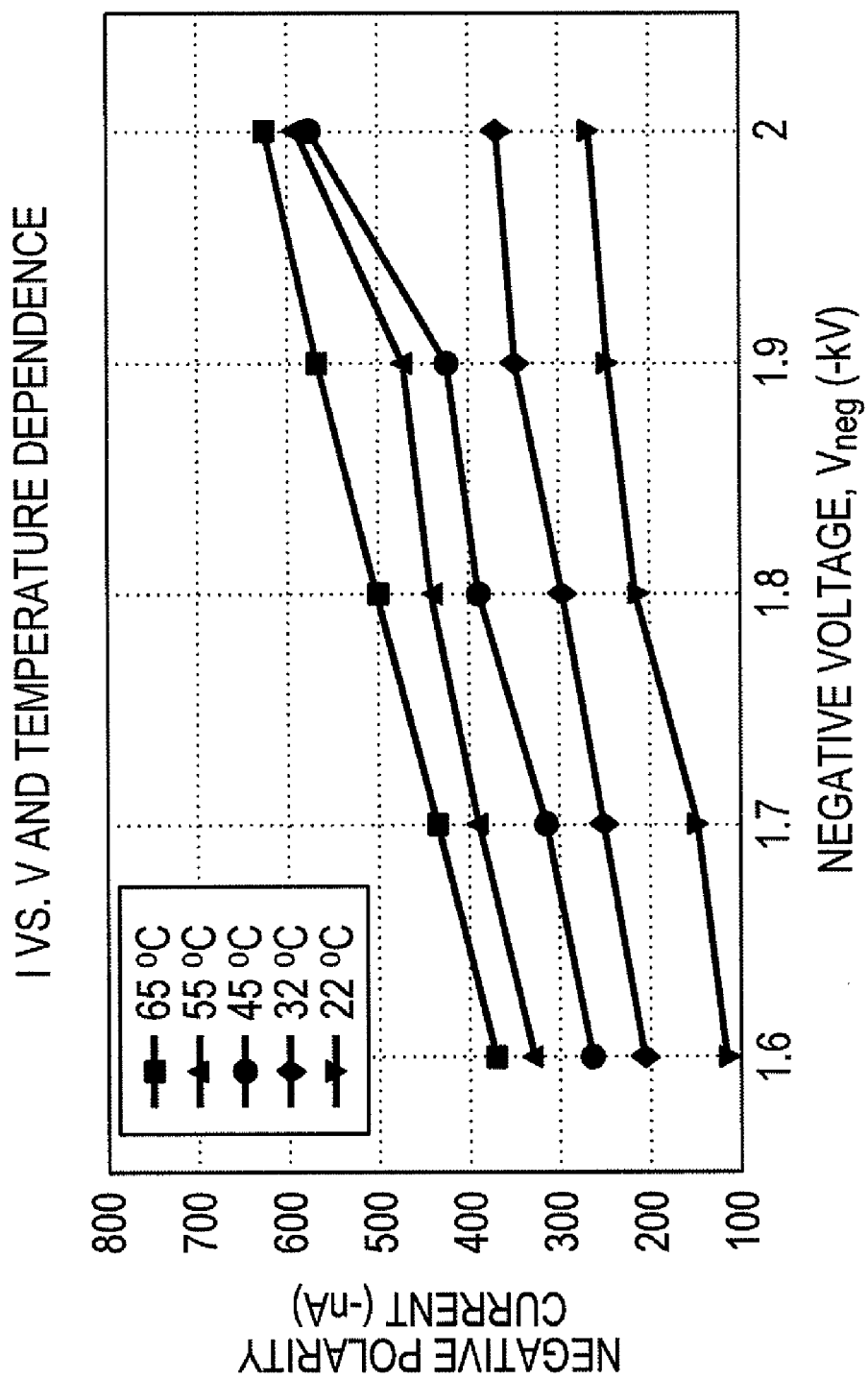
FIG. 5 is a graph showing the current in a negative ion beam generated by an ion source as a function of applied voltage for a range of temperatures, according to an illustrative embodiment of the invention.

Electric traction causes the transport of the liquid to the emitter tip while viscous friction impedes it. The viscosity of ionic liquids is dependent on temperature. FIG. 5 is a graph showing a current level from an ion source (e.g., as described above in FIG. 1) as a function of the applied voltage at different temperatures, according to an illustrative embodiment of the invention. Increasing the temperature can decrease viscosity and allow ionic liquid to move more rapidly towards the tip. It was found that the dependence of current on temperature exhibited also a linear behavior with a slope of approximately 6.4 nA/K. In these experiments, stable positive and negative ion emission was demonstrated from ±100 nA to little more than ±600 nA using voltage and temperature control. As seen in FIG. 5, an increase in temperature resulted in a greater current level in the beam of negative ions.

Figure 6A:
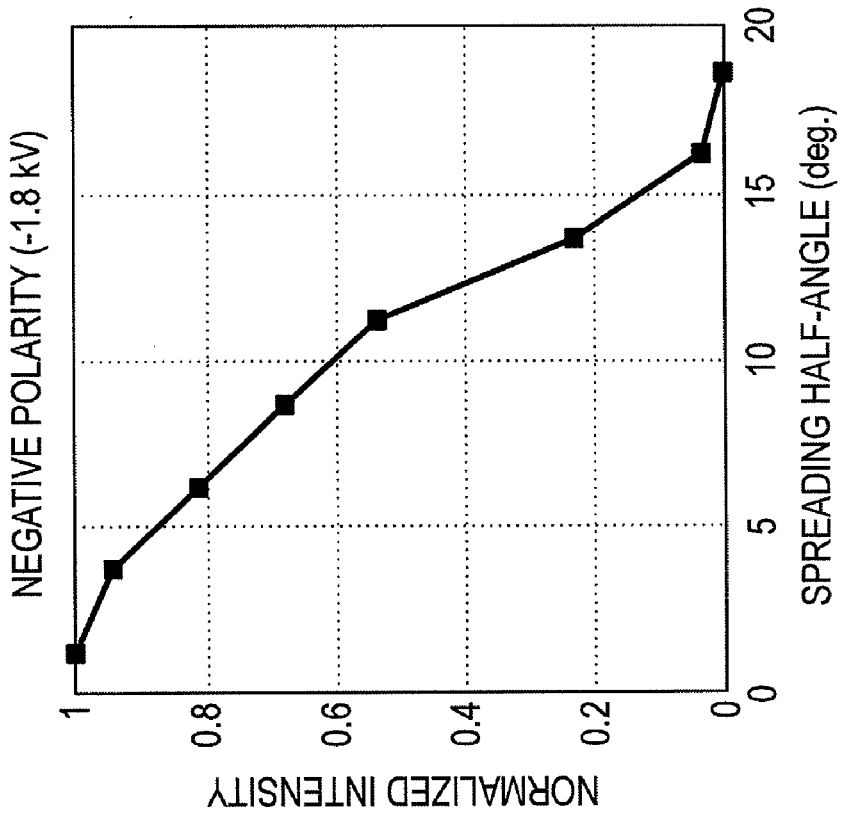
FIG. 6A is a graph showing a normalized intensity of a positive ion beam generated by an ion source as a function of a degree of spreading in the beam, according to an illustrative embodiment of the invention.
Figure 6B:
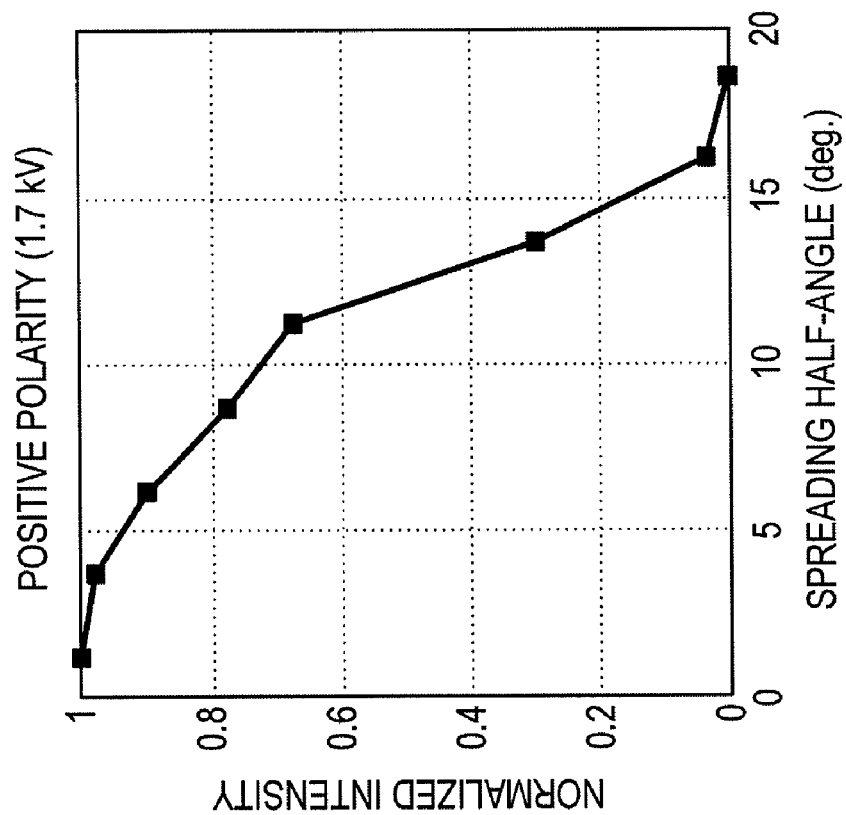
FIG. 6B is a graph showing a normalize intensity of a negative ion beam generated by an ion source as a function of a degree of spreading in the beam, according to an illustrative embodiment of the invention.

The benefits of ionic liquid ion sources include a wide range of available ionic masses (i.e. as compared to the limited number of liquid metals available), small energy deficits, narrow energy distributions and narrow angular distributions in the beam of ions generated in an ion source (e.g., as described in FIG. 1). FIGS. 6A and 6B show angular emission properties of ionic liquid ion sources, according to an illustrative embodiment of the invention. FIGS. 6A and 6B show the normalized intensity of an ion beam (y-axis) as a function of the angle of the beam (x-axis). FIG. 6A shows the characteristics of the positive ion beam source and FIG. 6B shows the characteristics of the negative ion beam source. It was found that beams spread at half-angles smaller than 18 deg from the centerline, where emission is strongest. FIGS. 6A and 6B demonstrate the non-thermal charge emission characteristics, where there is practically no particle flux outside the beam envelope.

Figure 7:
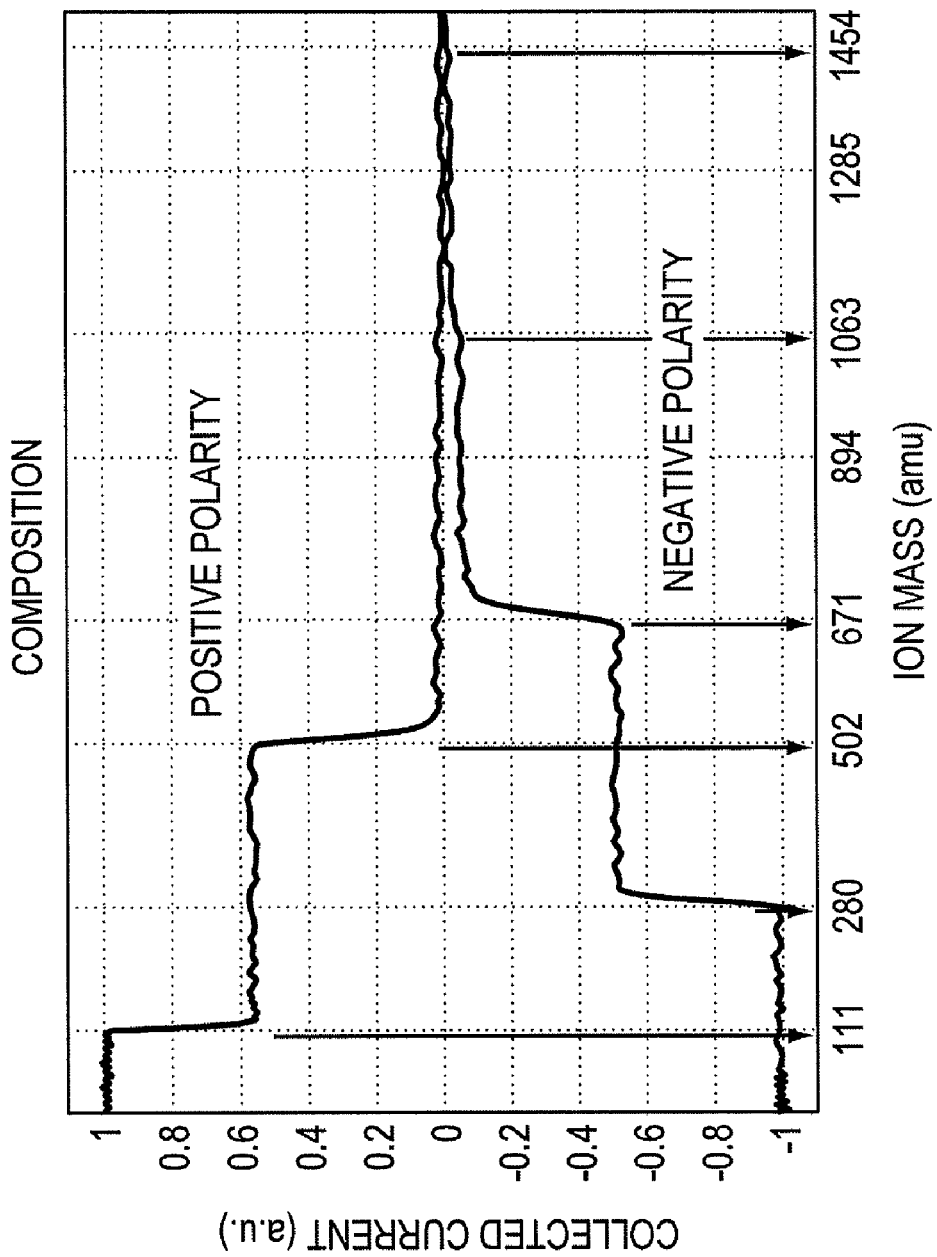
FIG. 7 is a graph from a time-of-flight spectrometer showing the current in a positive and negative ion beam generated by an ion source as a function of an ion mass of the ionic liquid, according to an illustrative embodiment of the invention.

FIG. 7 shows a graph showing the collected current from an emitter (e.g., emitter as described above in FIG. 1) as a function of ionic masses in EMI-Im ionic liquid, according to an illustrative embodiment of the invention. These time-of-flight (TOF) measurements showed exclusive emission of positive and negative ions of the form (EMI-Im)$_n$EMI$^+$ and (EMI-Im)$_n$Im$^−$ with n=0, 1, 2. The magnitude of the current for each mass can be read as the vertical size of the step.

Figure 8:
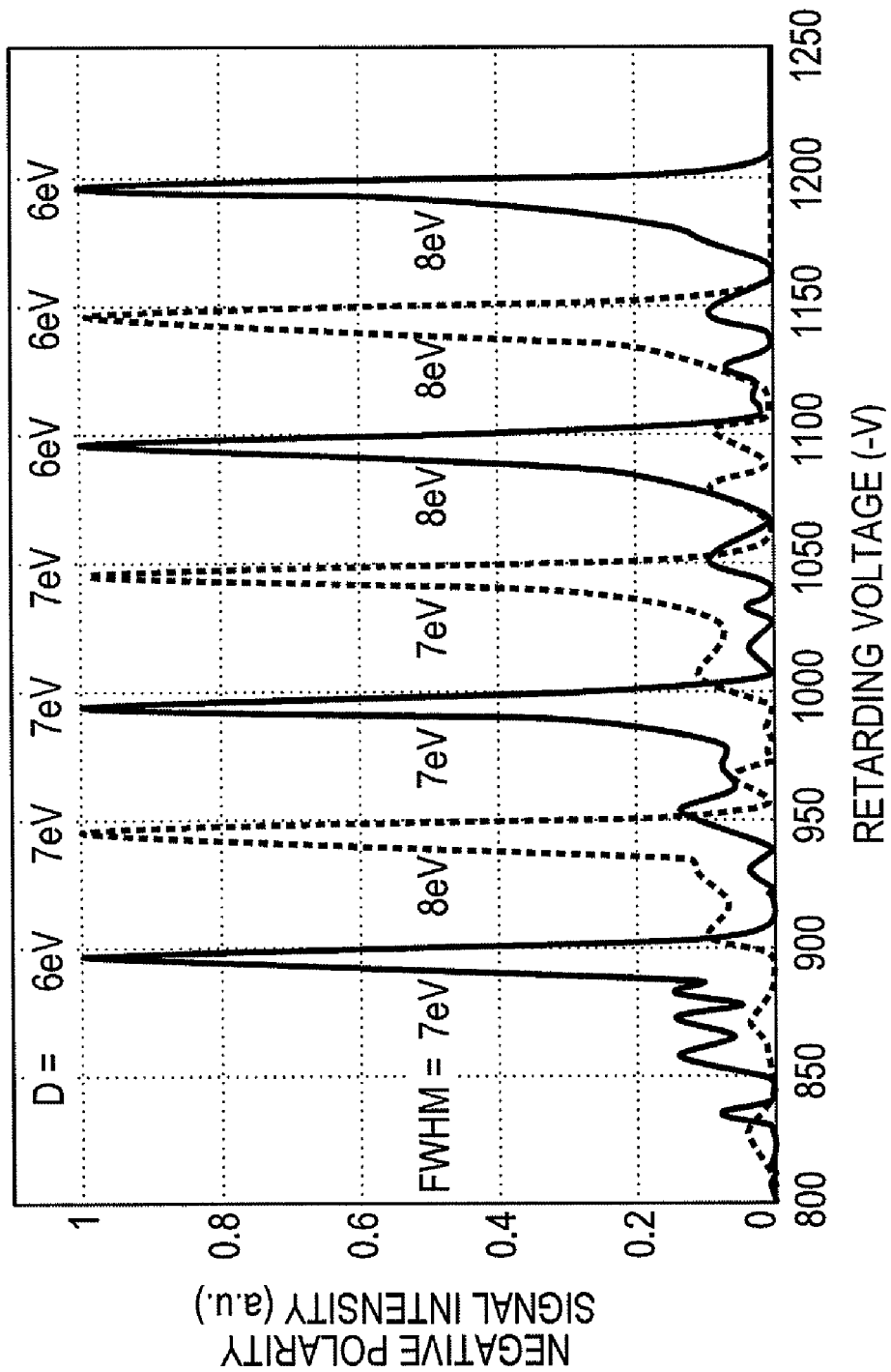
FIG. 8 is a graph showing the energy distributions of negative ion beams generated by an ion source as a function of an applied voltage in a retarding potential analyzer, according to an illustrative embodiment of the invention.

FIG. 8 shows energy distribution measurements of beams (y-axis) generated by an emitter (e.g., emitter as described above in FIG. 1) as a function of extracting voltages (x-axis), according to an illustrative embodiment of the invention. In FIG. 8, beams generated using ionic liquid (i.e. EMI-Im) were studied with a multi-grid retarding potential analyzer (RPA). Little energy of the order of ~7 eV (energy deficit) is spent in creating the ions, which are emitted with narrow distributions (~7 eV FWHM=full width at half maximum). FIG. 8, for example, shows the energy distributions of negative ions (mixed species) for different applied voltages. Given these energy characteristics, it is possible to use ion optics techniques to focus the ion beam and (i) reduce the amount of angular spreading and (ii) decelerate or accelerate the beam. Both aspects can be used for space propulsion applications to increase the efficiency of the thruster. Ionic liquid ion source beam properties can be used in focused ion beam applications. Furthermore, ionic liquid ion sources operating in negative mode can offer a simple (and cost-effective) alternative in an application market that does not have many options for nearly monochromatic negative ion sources.

Figure 9:
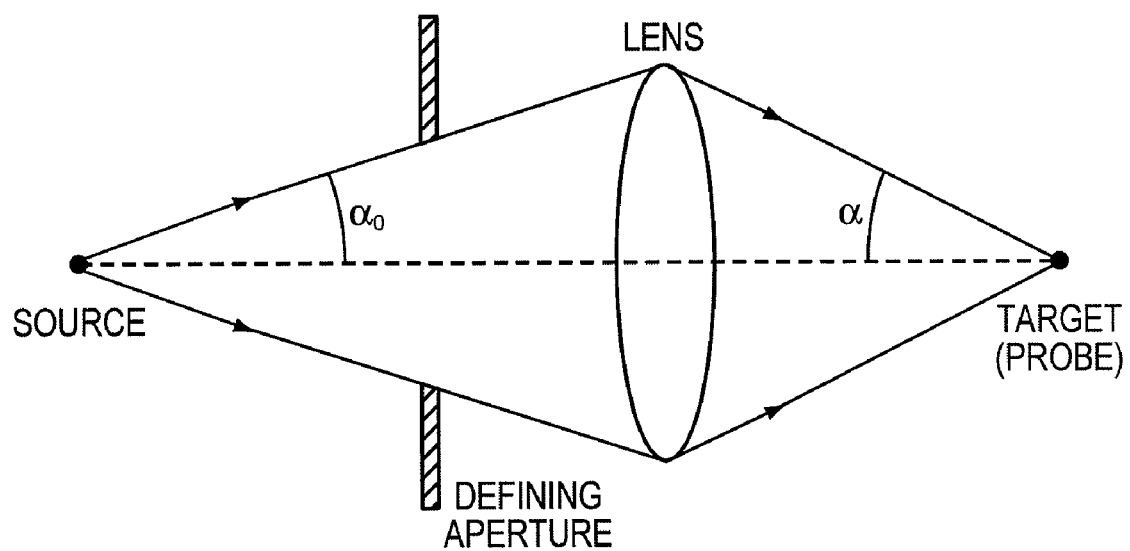
FIG. 9 is a schematic of an ionic beam and an electrostatic lens, according to an illustrative embodiment of the invention.

FIG. 9 depicts a single-lens focusing system, according to an illustrative embodiment of the invention. Ion-optics analysis can be used as an analogy to show that ionic liquid ion sources can be used in focused ion beam systems. The quality of the beam probe (the beam projected area on the target surface) generated by an emitter depends on the properties of the ion-optical system and the beam itself. It is advantageous for the probe size to be as small as possible in micro- and nano-manufacturing applications. This size, or circle of least confusion, will be determined by the different aberrations introduced by the optical system.

On-axis trajectories are not deflected from their original path while they traverse regions of varying electric potential, as long as this potential distribution has axial symmetry. The spherical nature of the field (its radial variation in cylindrical coordinates) introduces some variance on the axial position of the target point. The further away is the original trajectory from the axis (such that it traverses regions with higher potential curvature) the higher the axial displacement of the target point will be. This situation is encountered in ion and light optics alike and is referred to as spherical aberration and is characterized by large values of the angles from the centerline, labeled α in FIG. 9. Off-axis trajectories will then form a circular distribution at the target plane with a diameter given by:

$$d_s = \frac{1}{2}\alpha^3 C_s \quad \text{(EQN. 1.)}$$

where $C_s$ is a spherical aberration coefficient, which depends on the specific design of the optical system. Off axis trajectories can also depend on the magnification (M) as given by the Helmholtz-Lagrange relation, $$M = \frac{\alpha_0}{\alpha}\left(\frac{V_0}{V}\right)^{1/2} \quad \text{(EQN. 2.)}$$

where $V_0$ and V are the potentials of the source and target, respectively. The $\alpha^3$ dependence of this aberration makes it particularly problematic for non-paraxial trajectories. Nevertheless, the optical system can be optimized to work with low values of $C_s$ and to avoid highly inclined beam paths.

Diffraction has the potential of introducing aberrations on the target (or image side) of the optical system. The effects can be important when the probe size becomes of the order of the optical wavelength. In the case of visible light, the minimum size is limited to a wavelength of about 0.5 µm. One can do better with photons of higher energies, like UV and X-rays. In the case of molecular ions, the wavelength is given by de Broglie's relationship:

$$\lambda = h/p \quad \text{(EQN. 3.)}$$

where h is Planck's constant ($6.626 \times 10^{-34}$ J·s) and $$p = \sqrt{2m_i W} \quad \text{(EQN. 4.)}$$

where "p" is the ion momentum in terms of its mass ($m_i$) and beam energy W. The contribution of diffraction towards the increase in size of the circle of least confusion at the target is negligible in most cases. For instance, for a singly charged molecular ion of 100 amu, the wavelength is about $3 \times 10^{-12}$ m for a beam energy of only 1 eV. Diffraction can be therefore safely ignored.

Aberration is also introduced whenever particles in the beam do not share the same energy. A way to verify the dependence of energy spreads on the trajectories of ion beams results from analyzing the motion of a single ion moving in a region where a transversal electric field $E_y$ is applied (produced by a pair of infinite parallel plates, for instance). Suppose the ion enters this region after being accelerated along x to an energy W. The particle can follow a parabolic trajectory defined by:

$$y = E_y x^2 / 4W \quad \text{(EQN. 5.)}$$

or will cross a given y-plane after traveling a distance:

$$x \propto \sqrt{W} \quad \text{(EQN. 6.)}$$

In other words, the trajectory can depend on the initial energy W, and not on the specific charge of individual particles. A sensitivity analysis yields:

$$dx/x \propto dW/x^2 \propto dW/W \quad \text{(EQN. 7.)}$$

In the case of axially symmetric fields, the axial displacement would be geometrically proportional to the radial displacement. The variation in particle energies introduces what is known as chromatic aberration, which contributes with an effective probe size:

$$d_c = \alpha(\Delta W_{1/2}/W)C_c \quad \text{(EQN. 8.)}$$

where $\Delta W_{1/2}$ refers to the full-width-at-half-maximum (FWHM) of the energy distribution and $C_c$ is a chromatic aberration coefficient, which depends on the properties of the ion optics system.

Even in the ideal case of perfectly monoenergetic paraxial beams, the smallest probe will be determined by the physical size of the source, D. This is known as the source limit of an optical system, contributing with a diameter:

$$d_0 = MD \quad \text{(EQN. 9.)}$$

Reducing the magnification is not always a practical option to decrease the probe size because the increase in probe diameter due to spherical and chromatics aberration offsets gains in smaller $d_0$ under many operating conditions. Source size is an important limitation for plasma-based focused ion beam systems, where the ionization region is contained in a non-negligible volume. In field ionization/evaporation sources, the region where ions are produced is small in comparison and for many applications is regarded as a virtual point source. Nevertheless, in nano-manufacturing, the source size of field emitters should be taken into consideration for the final probe dimension.

An ionic liquid ion source can be formed by a semispherical cap at the end of an elongated protrusion issuing from the Taylor cone apex with a diameter that varies from about 1 nm to more than 50 nm, depending on the intensity of the emitting current. Schottky's field-enhanced thermionic emission relation can be made to estimate the relative sizes of liquid metal ion sources and ionic liquid ion sources:

$$j = \varepsilon_0 E_n \frac{kT}{h}\exp\left[-\frac{1}{kT}\left(G - \sqrt{\frac{q^3 E_n}{4\pi\varepsilon_0}}\right)\right] \quad \text{(EQN. 10.)}$$

where j is the current density, $E_n$ is the electric field normal to the liquid surface, q is the ion charge (Ze), k is Boltzmann's constant ($1.38 \times 10^{-23}$ J/K), $\varepsilon_0$ is the permittivity of vacuum ($8.854 \times 10^{-12}$ F/m) and G is the solvation energy of the bound ion. As can be seen from the expression above, significant ion emission is not triggered until the normal electric field satisfies:

$$E_n \approx 4\pi\varepsilon_0 G^2/q \quad \text{(EQN. 11.)}$$

with G given in eV. This electric field is also responsible for producing the traction that sustains the curvature of the semispherical cap, therefore:

$$E_n \propto \sqrt{\gamma/D} \quad \text{(EQN. 12.)}$$

where γ is the liquid surface tension.

Ionic liquids and liquid metals have very different physical and electrical properties, but the relevant quantities that determine the source size are the surface tension and solvation energy. At the threshold of emission, the relative source sizes should be approximately related by, $$\frac{D_{il}}{D_m} \approx \frac{\gamma_{il}}{\gamma_m}\left(\frac{G_m}{G_{il}}\right)^4 \quad \text{(EQN. 13.)}$$

The surface tension of ionic liquids in most cases (except for Cs) about an order of magnitude larger than in organic solvents. In general, values in metals can be typically about two to three times that of evaporation of molecular ions from liquid surfaces, therefore size ratios $D_{il}/D_m$ can be estimated between approximately 2 to 8.

Each one of these contributions (spherical and chromatic aberrations, and source limit) can be added in quadrature to obtain the total probe size:

$$d^2 = \frac{\alpha^6}{4}C_s^2 + \alpha^2\left(\frac{\Delta W_{1/2}}{W}\right)^2 C_c^2 + M^2 D^2 \quad \text{(EQN. 14.)}$$

An objective of the ion optical system is to compress as much current as possible into the smallest achievable area. An important figure of merit of focused ion beam ion sources is therefore the angular brightness, or angular current density $dI/d\Omega$, which characterizes the beam current emitted as a function of the solid angle projected from a virtual point source. The angular brightness is related to the beam current by:

$$I = \int (dI/d\Omega) d\Omega \quad \text{(EQN. 15.)}$$

Taking $dI/d\Omega$ as constant (assuming uniform profile) and from the definition of solid angle $$\Omega = 2\pi(1-\cos\theta) \quad \text{(EQN. 16.)}$$

we get $$I \approx \pi\alpha_0^2 (dI/d\Omega) = \pi M^2 \alpha^2 (dI/d\Omega) \quad \text{(EQN. 17.)}$$

after integrating between zero and the (small) source angle $\alpha_0$ and making use of einzel type optics ($V_0 = V$). The probe size becomes, $$d^2 = I^3 \frac{C_s^2}{(\pi M^2 dI/d\Omega)^3} + I\left(\frac{\Delta W_{1/2}}{W}\right)^2 \frac{C_c^2}{\pi M^2 dI/d\Omega} + M^2 D^2 \quad \text{(EQN. 18.)}$$

EQN. 18 reveals three operating modes with distinct characteristics depending on the beam current level. For large currents, spherical aberration dominates and $d \propto I^{3/2}$. For moderate currents, chromatic aberration is important and $d \propto \sqrt{I}$. For small currents, the probe dimension is limited by the source size alone and is independent of current.

Higher angular brightness can yield better optical performance, however, real ion sources can be susceptible to optical aberrations, in particular chromatic aberrations, which can be inherent to the emission process. Even sources with extremely high angular brightness would perform poorly in focused ion beam applications if the energy spread $\Delta W_{1/2}$ is also high. The relevant figure of merit to be maximized is what is known as the chromatic angular intensity, $$\Phi = \frac{dI/d\Omega}{(\Delta W_{1/2})^2} \quad \text{(EQN. 19.)}$$

A high chromatic angular intensity ($\Phi$) can mean not only high brightness, but also low energy spread. In liquid metal ion sources, both the angular brightness and the energy spread increase roughly linearly with current. Given the square dependence on the denominator in $\Phi$, this means that one would want to operate at the lowest possible currents. In fact, the best performance would occur for currents <1 µA. The problem with existing technologies, such as liquid metal ion sources, is that it becomes very difficult to obtain stable emission at such low currents. Fortunately for liquid metal ion sources, there is an atypical kink in the angular intensity curves at currents between 1 and 5 µA, producing a local maximum in $\Phi$. This is the optimal point at which focused ion beam from liquid metal ion sources work.

In contrast, ionic liquid ion sources nominally work stably at considerably lower currents than liquid metal ion sources. Currents between 10 and 1000 nA can be obtained. The angular brightness increases in that range (the emission angle does not grow as fast as the current itself) while the energy spread remains practically constant, as seen in FIG. 8. Given these low currents, most of the time focused ion beam ionic liquid ion sources would operate in the chromatic aberration regime, or even in the source limit regime. Decreasing the current while maintaining high brightness can be used to minimize aberrations in the system. Reducing aberrations in liquid metal ion sources, however, is difficult because they operate stably at larger currents, as described above. Furthermore, ionic liquid ion sources operate cold, while liquid metal ion sources operate hot. Thermal energy goes into beam aberrations by increasing the mean random kinetic energy of the flying ions. To minimize aberrations in the system, it is desirable to operate at lowest possible temperatures. High performance liquid metal ion source columns work in the former. In that case, the probe current density (j)

$$j = 4I/\pi d^2 \quad \text{(EQN. 20.)}$$

can be written as:

$$j \approx 4M^2\left(\frac{W}{C_c}\right)^2 \frac{dI/d\Omega}{(\Delta W_{1/2})^2} = 4M^2\left(\frac{W}{C_c}\right)^2 \Phi \quad \text{(EQN. 21.)}$$

Existing technologies, such as state-of-the-art liquid metal ion source optical columns operating at beam potentials of about 50 kV and two-lens optical systems achieve probe current densities as large as 50 A/cm² and probe diameters of less than 50 nm. Although very low, this size is still larger than the estimated source diameter of <5 nm for ionic liquid ion source structures.

Figure 10:
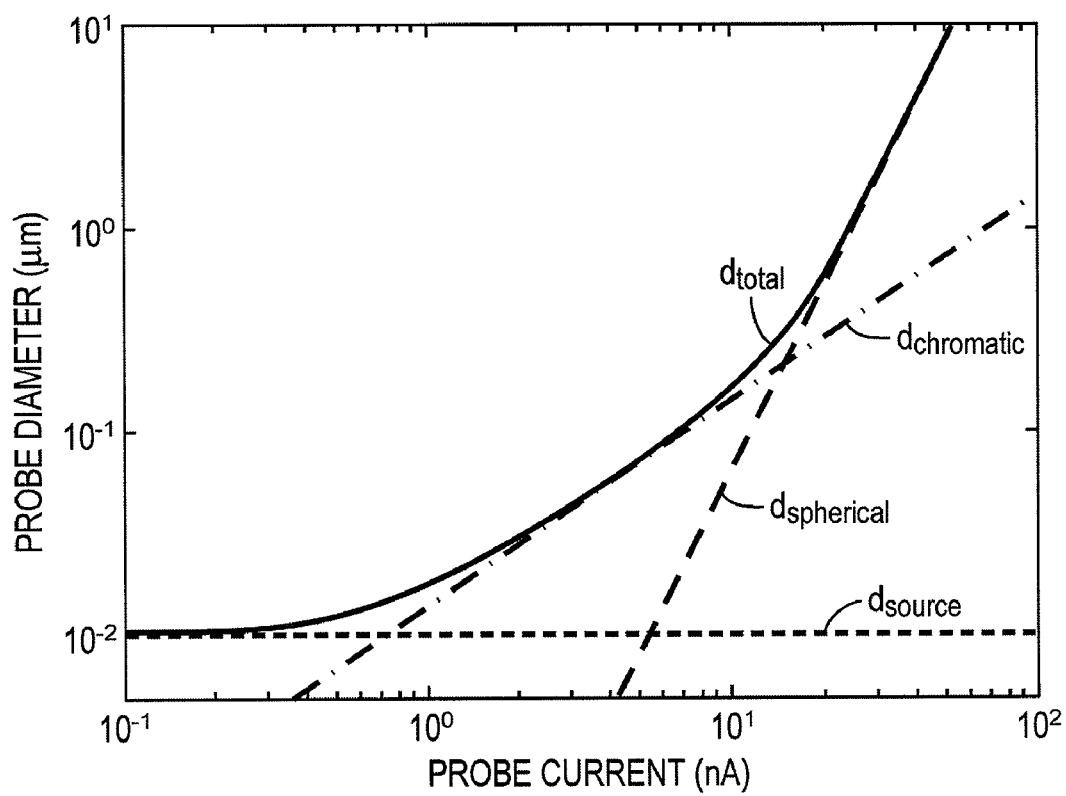
FIG. 10 is a graph showing a probe diameter as a function of probe current, according to an illustrative embodiment of the invention.

Determination of the optical properties for ionic liquid ion sources can depend on the aberration coefficients, which can depend on the geometry of the column and on the beam properties for a particular source. FIG. 10 shows an estimate of the probe size as a function of probe current for a single lens ionic liquid ion source column with no magnification operating at 600 nA and 18° beam half angle, which for a uniform distribution gives $dI/d\Omega=2$ µA/sr. FIG. 10 also shows that the FWHM is 7 eV and the column energy is 3 keV. In this embodiment, the source has an assumed (constant) diameter of 10 nm and the aberration coefficients (constant as well) can be chosen near the upper limit for an einzel lens column of reasonable size. Even though the values can be somewhat on the conservative side, the estimates are encouraging. The probe current density for a 50 nm diameter would reach a value of 152 A/cm$^2$, 3 times larger than the liquid metal ion source column described above.

An expression for beam perveance (P) follows:

$$P = I\sqrt{m_i/m_e}(W/q)^{-3/2} \quad \text{(EQN. 22.)}$$

where $m_e$ is the electron mass, is typically very low (in ionic liquid ion sources and liquid metal ion sources). In a practical situation, space charge can be neglected provided P<10$^{-8}$ A/V$^{3/2}$. Even for the heaviest molecular ions emitted by ionic liquid ion sources, P is smaller than this limit, as long as the beam potential W/q is higher than about 1.5 kV, which would be the case in operational focused ion beam columns.

Ionic liquid ion sources can be beneficial ion source because of the negative ions that they are capable of producing. The negative ions have advantages in terms of the interaction of the beam with electrically floating or dielectric substrates. For example, when an ion collides with the target surface (apart from implantation and sputtering effects, depending on the beam energy), electronic charge is transferred to or from the substrate material. If the target is a conductor, charges can redistribute quickly over its surface and can be transported away if the material is kept at a fixed potential (i.e., grounded or biased). If the conductor were insulated from its surroundings (i.e., floating), then the potential would shift positively upon surface redistribution for positive ion beams and negatively for negative ions. If the target were a dielectric, then charge would accumulate locally over the portion covered by the beam probe. The local electric potential would shift rapidly towards very high values with a polarity depending on the ion charge.

Particle trajectories and impact characteristics over the target could be affected if the surface potential becomes of the order of the beam potential. Given the high charging rate in floating or dielectric media, it could take approximately 1 µs for the potential to reach that condition, hence deteriorating the optical properties of the column. As a result, some focused ion beam systems utilize electron flooding to balance the accumulation of charge from positive ion beams.

In the case of positive ion beams, secondary emission will take negative charge away from the target surface, initially contributing to higher electric potentials in floating or dielectric materials. When the potential is higher than the secondary population energy (e.g., a few eV), electrons will not be able to escape and may not have any effect on the charging dynamics (this is reflected in the lower limit of the integral below). In the case of negative ion impingement, secondary emission limits the charge accumulation (therefore, the potential level) on these targets. Secondary electrons can efficiently take away a fraction of the incoming negative charge carried by the ions. If the steady state potential is relatively close to the original (design) probe potential, then charging effects in the column performance can be small and can be ignored.

Charging effects can be quantified using dynamic models, such as that by Guzdar et al. The electric potential φ is determined by Poisson's equation:

$$\nabla^2 \phi = -n/\epsilon_0 (q+q_s) \quad \text{(EQN. 23.)}$$

where n is the ion beam number density. The ion and secondary electron charges are q and $q_s = e\eta n_s/n$, respectively, where η is the secondary yield (number of secondary electrons released upon collision of an ion with the target) and $n_s$ is the secondary electron number density, found after integrating the following energy distribution function, $$\frac{n_s}{n} = \int_{e(\phi_c(L)+|\phi_c(L)|)/2}^{\infty} f(W)dW \text{ with } f(W) = \frac{2W_p W}{(W+W_p)^3} \quad \text{(EQN. 24.)}$$

where $W_p$ is the peak of the energy distribution and $\phi_c$ is the electric potential at the target surface. The beam motion is captured by 1-D continuity and momentum equations:

$$\frac{\partial n}{\partial t} + \frac{\partial}{\partial x}(nV) = 0 \text{ and} \quad \text{(EQN. 25.)}$$

$$\frac{\partial V}{\partial t} + V\frac{\partial}{\partial x}V = \frac{qE}{m_i} - vH(x-L)V \quad \text{(EQN. 26.)}$$

where V is the ion propagation velocity, L is the distance from the source to the target, H is the Heaviside function and ν is the ion slow down rate upon target collision, thus accounting for the charge accumulation dynamics.

For typical column sizes (L~50 cm), ion energies (W>5 keV) and secondary population peak energies ($W_p$~5 eV), the surface potential $\phi_c$ increases rapidly (in microseconds) to several times W/q as the positively charged beam produces a large number of secondary electrons. As the target potential increases, the ion energy is reduced near the surface due to electrostatic repulsion, thus producing less secondary emission. The potential then falls (within few microseconds) towards values near the beam energy W/q as the secondary production stabilizes. For instance, for the values shown above, an un-flooded floating/dielectric substrate could easily reach a potential of up to 5 kV with a singly charged positive ion beam, thus modifying considerably the optical properties of the column.

In the case of negative ion beams there is an analytical solution for the steady state situation in which no more charge accumulation occurs at the target. For singly charged negative ions, this condition reduces to $\eta n_s/n=1$, therefore, $$\frac{1}{n} = \int_{e\phi_c}^{\infty} f(W)dW \quad \text{(EQN. 27.)}$$

Simple integration results in the following expression for the target potential, $$\phi_c = \left[(\eta-1) + \sqrt{\eta(\eta-1)}\right]W_p/e \quad \text{(EQN. 28.)}$$

It is interesting to see that the potential at the target is positive, even for negatively charged beams, thus reducing the possibility of ion defocusing in the negative polarity. However, the asymptotic value of the target potential decouples completely from the beam energy and depends exclusively on the peak energy of the secondary population and the yield. A special case occurs when η=1, here the number of secondaries is the same as the incoming ions, and there is no charging, i.e. $\phi_c$=0. In any case, the potential will be no more than twice the yield times the secondary peak energy, which is a few eV. For example, with $W_p$=5 eV and η=5 the substrate charging potential induced by a 5 kV negative-ion optical column will be less than 1% of the beam energy. The corresponding effect on the ion trajectories will be very small.

While the invention has been particularly shown and described with reference to specific illustrative embodiments, it should be understood that various changes in form and detail may be made without departing from the spirit and scope of the invention.

What is claimed is:

1. An apparatus for producing negative ions, comprising:
   an emitter coated with an ionic liquid room-temperature molten salt;
   an electrode positioned downstream relative to the emitter;
   a power supply that applies a voltage to the emitter with respect to the electrode, sufficient to generate a stable high brightness beam of negative ions having minimal chromatic and spherical aberrations in the beam; and
   an electrostatic lens and a deflector to focus and direct the beam to a target.

2. The apparatus of claim 1 wherein the emitter is mounted on a dielectric enclosure.

3. The apparatus of claim 2 further comprising a cylinder mounted on the dielectric enclosure to store the ionic liquid wherein the cylinder is a diagnostic probe.

4. The apparatus of claim 3 wherein the cylinder is made of a conductive and non-corrosive material.

5. The apparatus of claim 4 wherein the cylinder is stainless steel.

6. The apparatus of claim 1 wherein the emitter generates a current of about 0.01-10 micro-Amps in the high brightness beam of negative ions having minimal aberrations.

7. The apparatus of claim 6 wherein the power supply applies a voltage to the emitter sufficient to generate the current of about 0.01-10 micro-Amps in the high brightness beam of negative ions.

8. The apparatus of claim 1 further comprising one or more emitters operated in parallel to generate higher currents in the high brightness beam.

9. The apparatus of claim 1 wherein the power supply applies a voltage of the opposite polarity to the emitter to generate a high brightness beam of positive ions with minimal chromatic and spherical aberrations.

10. A method for providing negative ions, comprising:
    coating an outer surface of an emitter with an ionic liquid room-temperature molten salt;
    applying a voltage to the emitter with respect to a downstream aperture, sufficient to generate a stable high brightness beam of negative ions having minimal chromatic and spherical aberrations in the beam;
    focusing the beam of negative ions; and
    directing the beam of negative ions to a target.

11. The method of claim 10 further comprising the step of applying a voltage of the opposite polarity to the emitter with respect to a downstream aperture, sufficient to generate a high brightness beam of positive ions with minimal chromatic and spherical aberrations.

12. The method of claim 10 wherein the step of applying the voltage sufficient to generate a beam having minimal aberrations further comprises the step of generating a current of about 0.01-10 micro-Amp in the beam.

13. The method of claim 10 wherein the target is at least one of a biological, or dielectric, or electrically floating, biased or grounded conductive substrate.

14. The method of claim 10 further comprising directing the beam to implant a substance in a micro-electronic device.

15. The method of claim 10 further comprising directing the beam of negative ions to generate a pattern on a target.

16. The method of claim 10 further comprising directing the beam of negative ions to scan the surface of a target and reconstruct a high resolution image of the surface via secondary emission.

17. The method of claim 10 further comprising storing the ionic liquid inside a metallic cylinder mounted on a dielectric enclosure.

18. The method of claim 17 further comprising using the metallic cylinder as a diagnostic probe.

19. A method of providing ions to at least one of a biological, or dielectric, or electrically floating conductive substrate, the method comprising:
    coating an outer surface of an emitter with an ionic liquid room-temperature molten salt;
    storing the ionic liquid inside a metallic cylinder mounted on a dielectric enclosure;
    using the metallic cylinder as a diagnostic probe;
    applying a negative voltage to the emitter with respect to an aperture to generate a beam of negative ions having minimal aberrations in the beam;
    focusing the beam of negative ions; and
    directing the beam of negative ions to at least one of a biological, or dielectric, or electrically floating, biased or grounded conductive substrate.

20. An apparatus for producing negative ions, comprising:
    an array of emitters coated with an ionic liquid room-temperature molten salt wherein the individual emitters are operated in parallel;
    an electrode positioned downstream relative to the emitter array;
    a power supply that applies a voltage to the emitter array with respect to the electrode, sufficient to generate a stable high brightness beam of negative ions having minimal chromatic and spherical aberrations in the beam wherein each individual emitter provides a current of about 0.01-10 micro-Amps in the beam; and
    an electrostatic lens and deflector to focus and direct the beam to a target.

* * * * *